United States Patent [19]

Steck

[11] Patent Number: 4,722,752

[45] Date of Patent: Feb. 2, 1988

[54] APPARATUS AND METHOD FOR RINSING AND DRYING SILICON WAFERS

[75] Inventor: Ricky B. Steck, West Jordan, Utah

[73] Assignee: Robert F. Orr, Salt Lake City, Utah

[21] Appl. No.: 874,383

[22] Filed: Jun. 16, 1986

[51] Int. Cl.$^4$ ............................................... B08B 3/10
[52] U.S. Cl. .................................... 134/25.4; 134/30; 134/135; 134/140
[58] Field of Search ................... 134/25.1, 25.4, 30, 134/135, 137, 140, 142, 154, 155

[56] References Cited

U.S. PATENT DOCUMENTS 4,318,749 3/1982 Mayer ................................ 134/25.4
4,643,774 2/1987 Kisnida et al. ...................... 134/25.4

FOREIGN PATENT DOCUMENTS 60-130832 7/1985 Japan ..................................... 134/32
1082498 3/1984 U.S.S.R. ................................ 134/32

Primary Examiner—Harvey C. Hornsby
Attorney, Agent, or Firm—Thorpe, North & Western

[57] ABSTRACT

Apparatus and method for rinsing and drying thin wafers such as silicon wafers or other disc-like substrates or elements wherein the wafers are rinsed in a hot water bath while supported in a conventional slotted carrier. The wafers are dried by slowly, raising the wafers out of the water bath such that the water surface tension at the surface of the water bath evenly and effectively draws off water from the rising surfaces of the wafers. A novel lift mechanism is provided for slowly and independently lifting the wafers and the cassette in which the wafers were supported during rinsing through the surface of the water such that there is no contact between the wafers and the cassette or between the wafers and any other object or between the cassette and any other object at the point where the cassette and wafers move through the surface of the water.

4 Claims, 7 Drawing Figures

APPARATUS AND METHOD FOR RINSING AND DRYING SILICON WAFERS

BACKGROUND OF THE INVENTION

1. Field

The invention relates to apparatus and methods of rinsing and drying silicon wafers or other wafers or thin disc-like substrates or elements in the semiconductor process industry.

2. State of the Art

In the processing of silicon wafers to make semiconductor devices, the wafers are subjected to a myriad of processing steps. It is practical to perform many of these steps on a batch of wafers positioned in a slotted carrier which is often referred to as a boat or as a cassette. The carriers have a plurality of spaced slots on the opposite vertical sides of carriers for receiving the wafers in edgewise, coaxial relation with the wafers being spaced from each other. The carriers have an opening in the bottom of the carrier for access to the bottom side edges of the wafers carried thereby. The top of the carriers are open to allow wafers to be inserted and removed therefrom.

Numerous cleaning, coating and diffusion steps are required in manufacturing semiconductor devices. The industry has been using what is known as a spin rinser/dryer for many years to effect a final spray rinse and spin dry of the silicon wafers. The rinser/dryers are essentially centrifuges which throw water from the wafers and the carriers in which the wafers are contained. Because of the spinning action that occurs in these machines, the silicon wafers are subjected to high stress. In addition, silicon dust is generated and redeposited on the wafers along with other particulate accumulations. The semiconductor industry is moving toward much smaller device geometries in very large scale integration of making silicon devices, and the particulate accumulation on the smaller device geometries creates tremendous defect problems during the final rinse and dry of the wafers.

Objectives

A principal objective of the present invention is to provide a practical system for efficiently rinsing and drying the silicon wafers without using a high speed spin or centrifuge. A particular objective is to provide compact, relatively inexpensive apparatus for rinsing and drying silicon wafers, wherein the wafers are rinsed in a tank of high purity, hot, deionized water, with the wafers being dried by slowly removing the wafers from the hot, deionized water. A further objective is to provide a system in which the wafers are rinsed in a tank using laminar, upward flow of high purity, hot, deionized water from the bottom of the tank, wherein the tank is provided with perimeter skimming or overflow to provide efficient removal of particulate contaminants. An additional objective is to provide a novel lift mechanism in combination with the laminar flow rinse tank wherein the cassette which holds the wafers during the rinsing operation and the wafers are slowly and independently passed or lifted through the surface of the hot, deionized water such that there is no contact between the cassette and wafers at the point where the cassette and wafers move through the surface of the hot, deionized water.

SUMMARY OF THE INVENTION

In accordance with the present invention, a novel method and apparatus are provided for final rinsing and drying of silicon wafers or other wafers or thin disc-like substrates or elements using a bath of high purity, hot, deionized water. The wafers, contained in a conventional cassette or carrier are submerged in a tank containing the hot, deionized water. The hot, deionized water is made to flow upwardly in laminar flow through the interior of the tank to remove particulates suspended in the water. A peripheral overflow of water from the tank effects a very efficient skimming action on the surface of the hot, deionized water, to thereby remove the particulates as they are flushed to the surface. The liquid laminar flow and surface skimming essentially reduces chances of particulates redepositing on the wafers.

Drying of the wafers is achieved simultaneously with the removal of the wafers from the hot, deionized water. A novel, vertical lift mechanism is provided for slowly lifting the silicon wafers and cassette out of the hot, deionized water bath. By slowly raising the wafers and the cassette through the surface of the water bath, water surface tension at the surface of the water bath evenly and effectively draws off water from the rising surfaces of the cassette and wafers. As the surfaces of the cassette and wafers slowly rise from the surface of the water, any water on the emerging surfaces of the cassette and wafers is drawn back to the water bath by surface tension action at the interface of the water bath with the cassette and wafers. A filtered, laminar flow of clean, dry air may be maintained above the water bath, and any residual moisture on the emerging surfaces of the hot wafers is quickly transferred to the clean, dry air.

A special lift mechanism is provided for lifting the cassette and the wafers from the water bath in distinct, independent operations. The lift mechanism comprises a support means for supporting the cassette and lift elements for lifting the wafers out of the cassette. Means are provided for moving the support means upwardly in a first movement to a position in which the upper edges of the cassette are positioned immediately beneath and adjacent to the surface of the hot, deionized water in the tank.

The lift elements are provided with means for engaging the bottom edges of the wafers through the opening in the bottom of the cassette. Means are provided for moving the lift elements upwardly in a second movement, wherein the bottom edges of the wafers engaged by the lift elements remain submerged with the lift elements beneath the surface of the hot, deionized water in the tank.

At the end of the second movement, i.e., the movement of the lift elements, the support means are moved upwardly in a third movement. Means are provided for moving the support means upwardly in this third movement to lift the cassette from the water bath and into reengagement with the wafers at positions along the side edges of the wafers which are above the surface of the hot, deionized water in the tank. The cassette then supports the wafers and lifts the wafers in the latter portion of the third movement completely out of the hot, deionized water in the tank.

The dry cassette containing the rinsed, dry wafers is then removed from the support means. Another cassette containing wafers which are to be rinsed can then be placed on the support means. The support means and the lift elements are then adapted to move downwardly in a fourth combined movement beneath the surface of the hot, deionized water to a position in which the cassette and the batch of wafers contained therein are submerged beneath the surface of the hot, deionized water in the tank. Following rinsing of the wafers, the cassette and wafers are then removed from the water bath by repeating the first through third movements of the lift mechanism as mentioned above.

Additional objects and features of the invention will become apparent from the following detailed description, taken together with the accompanying drawings.

THE DRAWINGS

A preferred embodiment of the apparatus of the present invention representing the best mode presently contemplated of carrying out the invention is illustrated in the accompanying drawings in which.

DETAILED DESCRIPTION OF THE ILLUSTRATED EMBODIMENT

Figure 2:
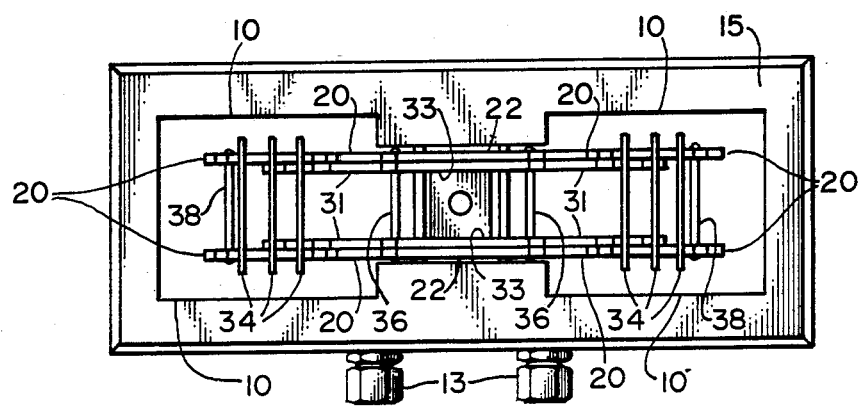
FIG. 2 is a top, plan view of the apparatus of FIG. 1.
Figure 3:
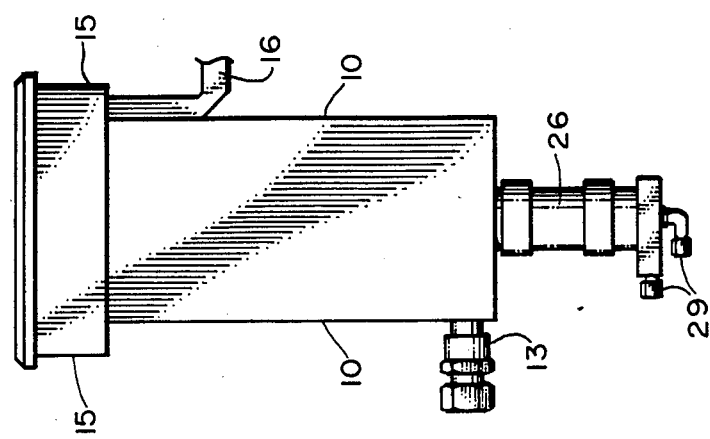
FIG. 3 is a side elevation of the apparatus of FIG. 1.

As illustrated, the invention comprises a pair of rinse tanks 10 positioned side-by-side and spaced slightly from each other. The tanks 10 are filled with high purity, hot deionized water. The temperature of the water is preferably at least about 90 degrees centigrade. A diffuser 11 is positioned within each of the tanks 10 adjacent to the bottom of the tanks 10. Hot, purified, deionized water is introduced into the tank 10 through the diffuser 11 to create a laminar flow of hot, deionized water upwardly through the tank 10. As best shown in FIGS. 2 and 3, inlet nozzles 13 are provided at the bottom of the tanks 10 for introducing the purified, hot, deionized water into the plenum between the diffusers 11 and the bottoms of the tanks 10.

Figure 1:
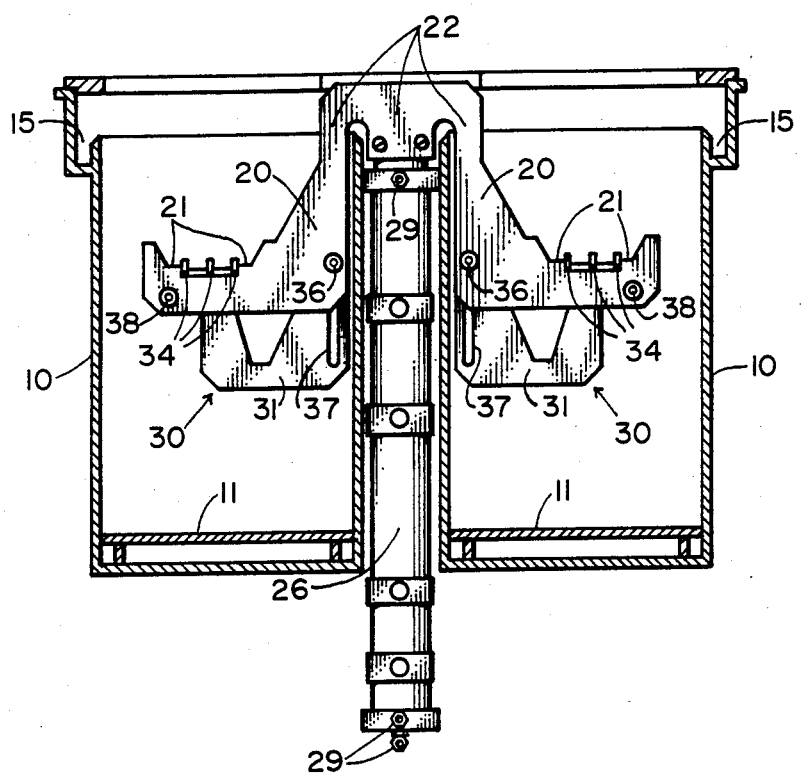
FIG. 1 is a front elevation of rinsing and drying apparatus in accordance with the invention comprising two side by side rinse tanks, with the rinse tanks shown in cross section to show the lift mechanism within the tanks.

The hot, deionized water passes through the diffuser 11 and flows upwardly in laminar flow within the tank 10. A peripheral overflow allows the hot, deionized water to drain from the top portion of the tank 10 by overflowing the periphery of the tank 10. As shown in FIGS. 1-3, the two, side-by-side tanks 10 are surrounded at their upper perimeter by a drain basin which takes the form of a peripheral overflow gutter 15 extending around the perimeter of the tanks 10. A drain pipe 16 drains the overflow water from the gutter 15. The laminar flow of hot, deionized water rinses semiconductor wafers which are placed in the tanks 10 and the upward flow of water, with the peripheral overflow, removes any particulates which are suspended in the hot, deionzied water. The peripheral overflow creates a very efficient skimming effect on the surface of the water in the tank 10.

It has been found that the semiconductor wafers can be very efficiently dried by slowly lifting the wafers through the surface of the hot water. The surface tension at the interface of the surface of the hot water and the respective wafers effectively draws water from the surfaces of the wafers. Essentially, by very slowly removing the wafers and the cassette assembly which supports the wafers, the capillary action at the interface with the surface of the water draws water from the wetted surfaces of the wafers and cassette assembly. The rate of movement of the wafers and the cassette should be about 2 inches per minute.

If, however, the wafers and the cassette holding the wafers are raised through the surface of the water together, with the side edges of the wafers engaged in the retention slots in the cassette, water is trapped and remains in the slots in the cassette around the edges of the wafers. The retained water causes water spotting on the edges of the wafers, and, in some instances, the drops of water caught in the slots in the cassette with the edges of the wafers can run across the face of the wafer after the cassette is removed from the water bath. The water running across the face of a wafer can cause damage to the entire wafer.

It has been found that if the wafers can be moved through the surface of the water bath such that at the interface with the surface of the water bath, the wafer is in contact with no other object, the water is drawn uniformly from the wafers and the surface of the wafer rising above the water will be dry. Likewise, it has been found that if the cassettes are moved through the surface of the water bath such that at the interface with the surface of the water bath, the cassette is in contact with no other object, the water is drawn uniformly from the cassettes, and even the slots in the cassettes will be dry as they rise above the water. A special lift mechanism must be provided to accomplish the independent movement of the wafers and the cassette through the surface interface of the water bath.

Figure 4:
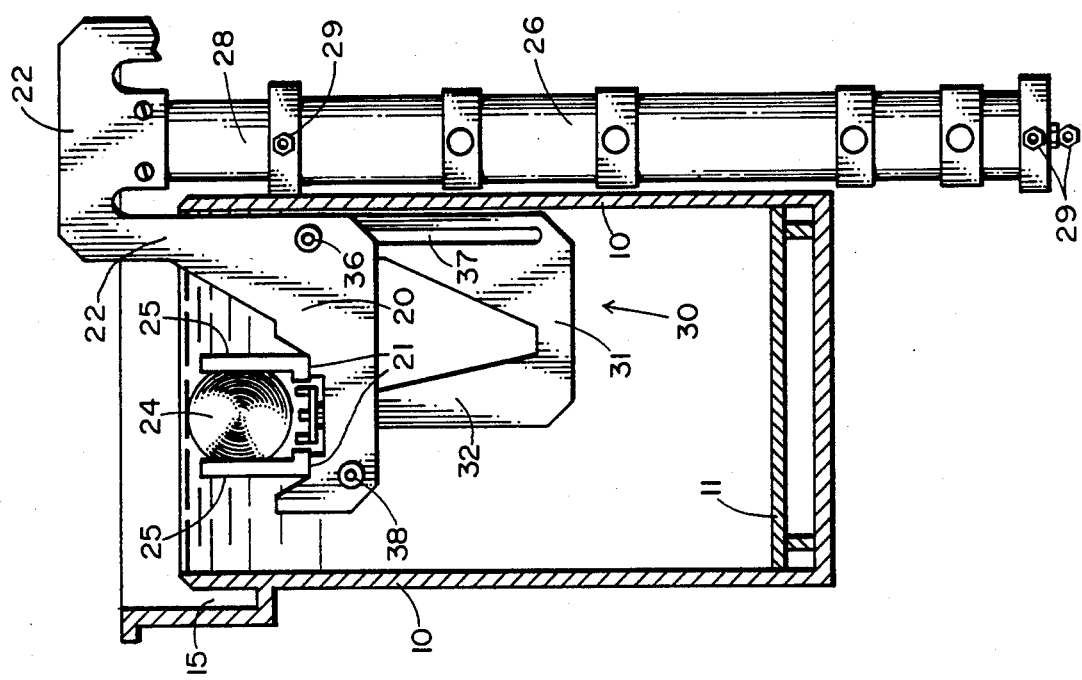
FIG. 4 is a cross section view through one of the tanks of the apparatus of FIG. 1, showing the lift mechanism in one of its characteristic positions.
Figure 5:
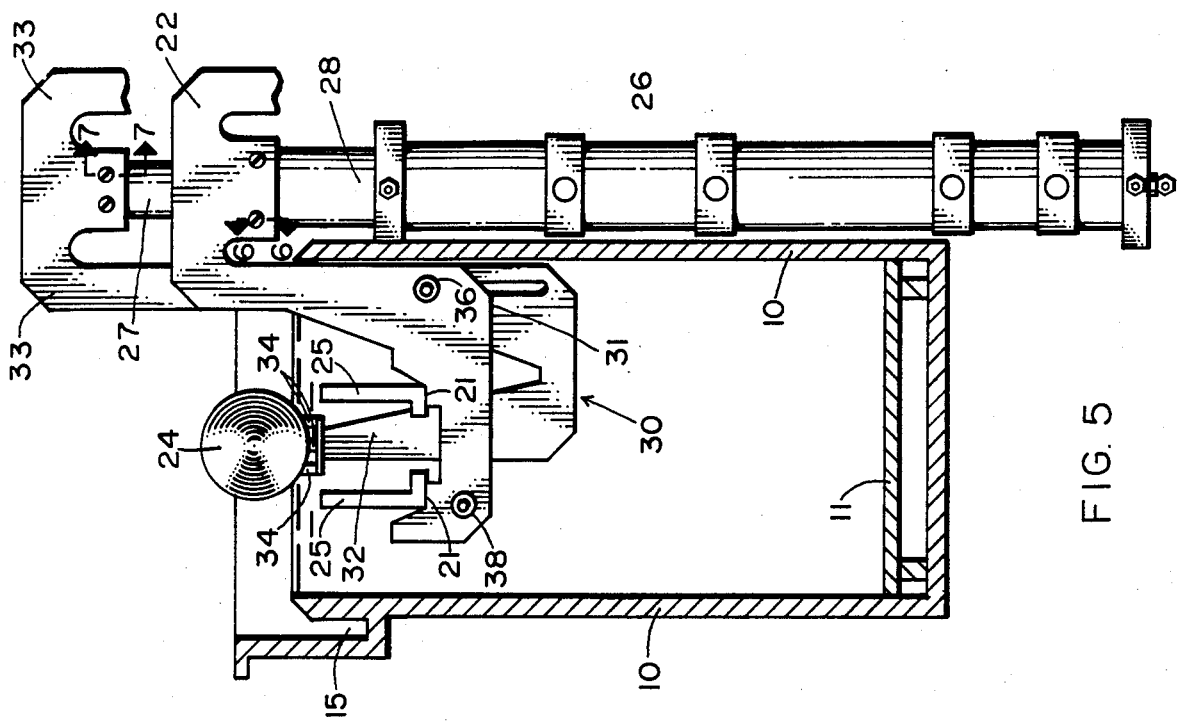
FIG. 5 is a view similar to that of FIG. 4, showing the lift mechanism in another of its charactertistic positions.

The special lift mechanism comprises a support means positioned within each of the tanks 10 for supporting at least one cassette and its mutually respective batch of wafers. The support means must recede into the tank 10 such that the cassette and the batch of wafers carried therein are completely submerged beneath the surface of the deionized water in the tank 10. In the illustrated embodiment, the support means comprises a pair of support plates 20 positioned in parallel within the tanks 10. The support plates 20 are supported from a lift means which can lift the plates 20 up and down within the tanks 10. Each of the support plates 20 has a pair of flat knife edge ledges 21 upon which the cassette 25 is received, as best shown in FIGS. 4 and 5. The pair of plates 20 are spaced such that the flat ledges 21 on the respective pair of plates 20 form a four point support for the cassette.

As illustrated, each pair of plates 20 in one tank 10 are connected to the pair of plates 20 in the adjacent tank 10. The respective plates 20 are interconnected by connector arms 22 which extend upwardly over the top of the tanks 10. These connector arms 22 are also attached to a lift mechanism for moving the plates 20 up and down. The lift mechanism comprises a dual piston hydraulic system 26 positioned between the space between the adjacent tanks 10. The connector arms 22 are connected to one of the pistons of the hydraulic system 26 as will be described more fully hereinafter.

Lift means are provided within each tank 10 for independently lifting respective batches of wafers from the cassette 25. The lift means comprises a number of lift elements 30 corresponding to the number of cassettes which can be supported within each tank 10. As illustrated, each tank 10 is adapted to receive and have supported therein one cassette. Thus, each tank 10 has one lift element 30.

The lift elements as illustrated comprise a pair of lift plates 31 which are positioned alongside respective support plates 20 of the support means for the cassette 25. The lift plates 31 are adapted to move upwardly and downwardly in parallel fashion beside the corresponding support plates 20 of the support means for the cassette 25. Each of the lift plates 31 has an elongated outer leg 32 positioned alongside a respective support plate 20. The legs 32 of the lift plates 31 are oriented essentially perpendicular to the generally horizontally extending support plates 20, with the legs 32 being adapted to move from a lowered position (FIG. 4) beneath a cassette 25 supported on the support plates 20, through the opening in the bottom of the cassette 25 to an elevated position (FIG. 5) extending through the cassette 25.

Similar to the support plates 20, each pair of lift plates 31 in one tank 10 are connected to the corresponding pair of plates 31 in the adjacent tank 10. The respective plates 31 are interconnected by connector arms 33 which extend upwardly over the top of the tanks 10. These connector arms 33 are also attached to a lift mechanism for moving the lift plates 31 up and down. The lift mechanism comprises a dual piston hydraulic system 26 positioned between or adjacent to the tanks 10. The connector arms 33 are connected to one of the pistons of the hydraulic system 26 as will be described more fully hereinafter.

Engagement means are provided on the upper ends of the legs 32 of respective pairs of lift plates 31 for engaging the bottom edges of wafers 24 in a mutually respective cassette 25 and lifting the wafers 24 upwardly out of the cassette 25 as the lift elements 30 move from their lowered position to their elevated position. As illustrated, the engagement means comprises three closely spaced, essentially parallel bars 34 which extend between the upper ends of mutually respective legs 32 of the pairs of lift plates 31. As is well known in the semiconductor processing art, the bars 34 are provided with slots which engage the bottom edges of the wafers 24 as the bars 34 move upwardly. Such engagement means, including parallel bars 34, are well known in other apparatus used in transferring wafers from one carrier or cassette to another, and further description of the engagement system is not deemed necessary.

Spacer elements can be provided to maintain the support plates 20 in proper orientation and spacing. As illustrated, a pin 36 extends between the interior portions of each pair of support plates 20. The interior side of each lift plate 31 has an elongate, essentially vertically oriented slot 37 through which the respective pin 36 passes. As the lift plates 31 move, the guide pins 36 move back and forth within the slots 37 without any contact with the lift plates 31. The pins 36 hold the interior portions of the support plates 20 at their proper orientation and spacing. Similar pins 38 can be provided extending between the exterior portions of respective pairs of support plates 20 to hold the exterior portions of the support plates 20 in proper orientation and spacing.

In operation, the apparatus is used to accomplish a novel method of rinsing and drying silicon wafers. The wafers 24 to be rinsed and dried are supported edgewise along the opposite sides of a slotted carrier, such as a cassette 25. The wafers 24 are supported in the cassette 25 in spaced, parallel, coaxial relation. The cassette is supported on the support ledges 21 of a respective pair of support plates 20.

The cassette 25 and its batch of wafers 24 are submerged beneath the surface of the hot, deionized water in tank 10. Hot, deionized water is introduced into the tank 10 through the diffuser 11 to create a liquid laminar flow of hot, deionized water upwardly through the tank 10 and about the wafers 24 and cassette 25 which are submerged in the water in the tank 10. The wafers 24 and cassette 25 are left submerged in the tank 10 for a time sufficient to rinse the wafers 24.

Following the rinse, the wafers 24 and cassette 25 are slowly raised from the water in the tank 10 to effect simultaneous drying and removal of the wafers 24. In a first movement, the cassette 25 and the wafers supported therein are slowly raised to a position as shown in FIG. 4 in which the upper edges of the cassette 25 are positioned immediately beneath and adjacent to the surface of the hot, deionized water in the tank 10.

Figure 6:
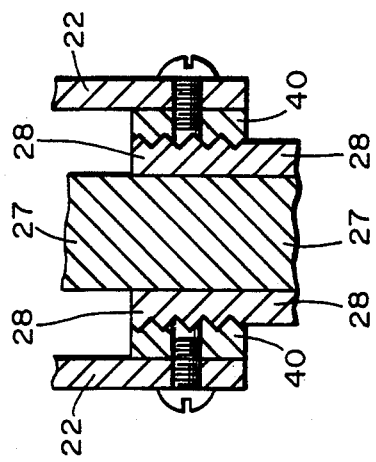
FIG. 6 is a cross sectional view of the connection of one part of the lift mechanism to one of the elevator shafts as taken along line 6—6 of FIG. 5.

Raising of the cassette 25 in this first movement is accomplished by appropriate means such as the hydraulic system 26 for moving the support plates 20 upwardly within the tank 10. The hydraulic system comprises a pair of pistons 27 and 28. Advantageously, the pistons are of the coaxial type in which the outer piston 28 forms a sleeve about the inner piston 27. The pistons 27 and 28 are driven independently by hydraulic fluid as is well known in the art. The connector arms 22 of the support plates 20 are connected to a block 40 as shown in FIG. 6. The block 40 is in turn connected, such as by threaded engagement, with the outer piston 28. In the first movement, the piston 28 is driven upwardly to a controlled position in which the cassette 25 and wafers 24 are located immediately beneath the surface of the water in the tank as explained above.

Following the completion of the first movement, the lift elements 30 are slowly raised upwardly in a second movement. The legs 32 of the lift elements 30 are raised through the opening in the bottom of the cassette 25, with the bars 34 engaging the bottom edges of the wafers 24. As the legs 32 continue to rise through the cassette 25, the wafers 24 are slowly lifted out of the cassette 25 and partially through the surface of the water in tank 10 to a position as shown in FIG. 5 in which the bottom edges of the wafers 24 which are engaged by the bars 34 of the lift element 30 remain submerged with the lift elements 30 beneath the surface of the water in the tank 10.

Figure 7:
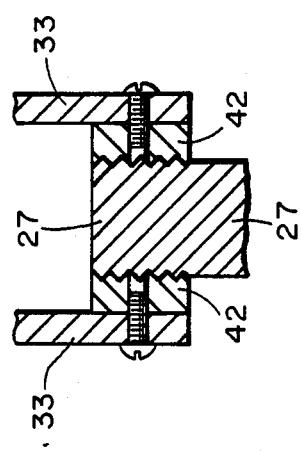
FIG. 7 is a cross sectional view of the connection of another part of the lift mechanism to a second elevator shaft as taken along line 7—7 of FIG. 5.

Raising of the lift elements 30 in this second movement is accomplished by appropriate means such as the inner piston 27 of the hydraulic system 26. The connector arms 33 of the lift plates 31 are connected to a block 42 as shown in FIG. 7. The block 42 is in turn connected, such as by threaded engagement, with the inner piston 27. In the second movement, the piston 27 is driven upwardly to a controlled position in which the wafers 24 are located with their bottom edges submerged immediately below the surface of the water as shown in FIG. 5.

As the wafers 24 emerge from the surface of the water to their positions shown in FIG. 5, the only contact made with the wafers by another object is that of the bars 34 of the lift elements 30, and this contact is beneath the surface of the water. Water from the emerging surfaces of the wafers 24 is drawn off by water surface tension at the interface of the water surface and the wafers 24. The portions of the wafers 24 above the water surface dry immediately at the water surface as the wafers 24 rise out of the water.

Upon completion of the second movement, wherein the wafers are raised to the position shown in FIG. 5, the slotted carrier or cassette 25 is slowly raised upwardly in a third movement. The cassette 25 slowly rises through the surface of the water, and as the cassette 25 passes through the surface of the water, the emerging portions of the cassette 25 are immediately dried, with the water on such portions being drawn off by water surface tension at the interface of the water surface and the cassette 25. It has unexpectedly been found that even the empty slots in the sides of the cassette 25 which are otherwise used to hold the wafers 24 dry completely as they slowly rise out of the water. This is the opposite of what happens if the slots contain the edges of the wafers 24 as the slots emerge from the water. In the latter situation, water is held between the edges of the wafers 24 and the slots as mentioned hereinbefore.

The dry slots in the cassette 25 rise sufficiently to reengage the side edges of the wafers 24 above the surface of the water. Because the slots and the wafers 24 are both dry, there is no problem with water spotting and contamination of the wafers 24. The cassette continues to move upwardly to support and lift the wafers 24 completely out of the water. As the lower edges of the wafers rise through the water surface, there is no other contact at the water surface with any other object, and the lower edges of the wafers dry completely as they emerge from the water.

Raising of the cassette 25 in this third movement is accomplished by appropriate means such as the outer piston 27 of the hydraulic system 26. The movement of each of the pistons 27 and 28 of the hydraulic system 26 is readily controlled by controlling the flow of hydraulic fluid to the hydraulic system 26 through nipples 29 on the hydraulic system 26. The source of hydraulic fluid is not shown in the drawings. Hydraulic pumps and controls therefore are well known in the art.

After the cassette 25 and wafers 24 have been raised completely out of the water, the dried cassette containing the rinsed and dried wafers 24 is removed from the support plates 20. Another cassette containing additional wafers can then be placed on the support plates 20, and the support plates 20 and lift elements 30 are then retracted or lowered such that the cassette and wafers are completely submerged in the water. The rinsing and drying operation as described above is then repeated.

Although a preferred embodiment of the apparatus has been illustrated and described, it is to be understood that the present disclosure is made by way of example and that various other embodiments are possible without departing from the subject matter coming within the scope of the following claims, which subject matter is regarded as the invention.

I claim:

1. Apparatus for rinsing and drying of wafers which are contained within a slotted carrier in edgewise, parallel, coaxial arrangement with said slotted carrier having an opening in the bottom thereof and an essentially open top, said apparatus comprising a tank filled with high purity, hot, deionized water;
a diffuser;
means for introducing high purity, hot, deionized water into the tank through said diffuser to create laminar flow of hot, deionized water upwardly through said tank;
a peripheral overflow which allows hot, deionized water to drain around the periphery of said tank;
support means within said tank for supporting at least one of said slotted carriers and a mutually respective batch of wafers such that each such slotted carrier and batch of wafers carried therein are completely submerged beneath the surface of the deionized water in said tank;
lift means within said tank for lifting the respective batches of wafers from said slotted carriers, said lift means comprising a number of lift elements corresponding to the number of slotted carriers which can be supported on said support means, said lift elements being movable from a lowered position beneath a mutually respective slotted carrier supported on said support means through the opening in the bottom of said respective slotted carrier to an elevated position adjacent to the top of said respective slotted carrier;
means on said lift elements for engaging the bottom edges of the wafers in a mutually respective slotted carrier and lifting the wafers upwardly out of said respective slotted carrier as said lift elements move from their lowered position to their elevated position;
means for moving said support means upwardly in a first movement to a position where the upper edges of said slotted carriers are positioned immediately beneath and adjacent to the surface of the hot, deionized water in said tank;
means for moving said lift elements of said lift means upwardly in a second movement following the completion of said first movement of said support means, with said lift means engaging and lifting the wafers out of the respective slotted carriers and partially through the surface of the hot, deionized water in said tank to a position at the end of said second movement wherein the bottom edges of said wafers which are engaged by said lift means remain submerged with said lift means beneath the surface of the hot deionized water in said tank;
means for moving said support means upwardly in a third movement following the completion of said second movement of said lift elements, wherein the slotted carrier reengages said wafers at positions along the side edges of said wafers which are above the surface of the hot, deionized water in said tank, with the slotted carrier then supporting and lifting said wafers completely out of the hot, deionized water in said tank.

2. Apparatus in accordance with claim 1, wherein there are further provided means for moving said support means and said lift elements in a fourth combined movement downwardly beneath the surface of the hot, deionized water to a position in which the slotted carriers and batches of wafers supported on said support means are submerged beneath the surface of the hot, deionized water in said tank; and means for repeating said first, second and third movements.

3. Apparatus in accordance with claim 1, wherein
the means for moving said support means in the first and third movements comprises a hydraulic piston coupled to said support means and controlled to produce the first and third movements; and
the means for moving said lift elements in the second movement comprises a second hydraulic piston coupled to said lift elements and controlled to produce the second movement.

4. A method of rinsing and drying wafers comprising the steps of:
 (a) placing the wafers to be rinsed and dried in a slotted carrier wherein the wafers are supported edgewise along the opposite sides of said slotted carrier in spaced, parallel, coaxial relation;
 (b) submerging said slotted carrier and the wafers which are to be rinsed and dried beneath the surface of hot, deionized water in a tank;
 (c) introducing hot, deionized water into said tank through a diffuser to create a laminar flow of hot, deionized water upwardly through said tank and about said wafers and slotted carrier which are submerged in the hot, deionized water;
 (d) maintaining the wafers and slotted carrier submerged in said tank for a time sufficient to rinse said wafers;
 (e) slowly raising the slotted carrier containing the rinsed wafers in a first movement to a position in which the upper edges of the slotted carrier are positioned immediately beneath and adjacent to the surface of the hot, deionized water in said tank:
 (f) following the completion of said first movement in step (3), slowly raising a lift element upwardly in a second movement through the opening in the bottom of said slotted carrier to engage the bottom edges of said wafers and to slowly lift the wafers out of the slotted carrier and partially through the surface of the hot, deionized water in said tank to a position in which the bottom edges of said wafers which are engaged by said lift means remain submerged with said lift means beneath the surface of the hot, deionized water in said tank; and
 (g) following the completion of said second movement in step (f), slowly raising the slotted carrier upwardly in a third movement, such that the slotted carrier reengages said wafers at positions along the side edges of said wafers which are above the surface of the hot, deionized water, with the slotted carrier then supporting and lifting said wafers completely out of said hot, deionized water in said tank,
wherein the movement of said slotted carrier and said lift element is sufficiently slow that the deionized water is drawn from the wafers and the slotted carrier by water surface tension as the wafers and slotted carrier move across the interface with the surface of the deionized water.

* * * * *